(12) United States Patent
Baik et al.

(10) Patent No.: US 6,579,668 B1
(45) Date of Patent: Jun. 17, 2003

(54) PHOTORESIST REMOVER COMPOSITION

(75) Inventors: Ji-Hum Baik, Yongin (KR); Chang-Il Oh, Seongnam (KR); Sang-Dai Lee, Kyungki-do (KR); Chong-Soon Yoo, Seoul (KR)

(73) Assignee: Dongjin Semichem Co., Ltd., Incheon (KR)

( * ) Notice: Subject to any disclaimer, the term of this patent is extended or adjusted under 35 U.S.C. 154(b) by 0 days.

(21) Appl. No.: 10/069,243

(22) PCT Filed: Aug. 14, 2000

(86) PCT No.: PCT/KR00/00902

§ 371 (c)(1),
(2), (4) Date: Feb. 15, 2002

(87) PCT Pub. No.: WO01/14934

PCT Pub. Date: Mar. 1, 2001

(30) Foreign Application Priority Data

Aug. 19, 1999 (KR) ............................................. 99-34323

(51) Int. Cl.⁷ ................................................. G03F 7/42
(52) U.S. Cl. ........................ 430/331; 430/329; 510/176
(58) Field of Search ................................ 430/331, 329; 510/176

(56) References Cited

U.S. PATENT DOCUMENTS

| | | |
|---|---|---|
| 4,401,747 A | 8/1983 | Ward, Jr. et al. |
| 5,139,607 A | 8/1992 | Ward et al. |
| 5,972,862 A * | 10/1999 | Torii et al. .................. 510/176 |

FOREIGN PATENT DOCUMENTS

| | | | |
|---|---|---|---|
| EP | 267540 | * | 5/1988 |
| JP | 64042653 | | 2/1989 |
| JP | 04124668 | | 4/1992 |
| JP | 04350660 | | 12/1992 |
| JP | 05273768 | | 10/1993 |
| JP | 05281753 | | 10/1993 |
| JP | 08202052 | | 8/1996 |
| KR | 1995238 B1 | | 1/1995 |

* cited by examiner

*Primary Examiner*—Richard L. Schilling
(74) *Attorney, Agent, or Firm*—Baker Botts LLP

(57) ABSTRACT

A photoresist remover composition including: 10 to 30% by weight amine compound; 20 to 60% by weight glycol series solvent; 20 to 60% by weight polar solvent; and 0.01 to 3% by weight perfluoroalkylethyleneoxide. The performance of the photoresist remover composition in stripping the photoresist residue, which is generated by dry or wet etching, ashing or ion implantation, from a substrate is enhance, and the photoresist remover composition is able to be smoothly applied over a variety of metal layers including an aluminum (Al) layer. Also, the photoresist remover composition corrodes the metal layers very little.

9 Claims, 1 Drawing Sheet

PHOTORESIST REMOVER COMPOSITION

TECHNICAL FIELD

The present invention relates to a photoresist remover composition, and more particularly, to a photoresist remover composition for removing photoresist from a substrate during a photolithography process which is applied in manufacturing semiconductor devices and liquid crystal displays (LCDs).

BACKGROUND ART

Photolithography is a common process applied in manufacturing semiconductor devices, such as integrated circuits (ICs), large scale integrated circuits (LSIs), very large scale integrated circuits (VLSIs), and picture display devices, such as liquid crystal displays (LCDs) and plasma display panels (PDPs).

Briefly, in a photolithography process, a photoresist layer is deposited on a predetermined substrate, for example, a semiconductor substrate or a glass substrate. The substrate to which the photoresist is applied may be a bare substrate which has not undergone any process before the photolithography process. However, it is usual that the substrate exposed to the photolithography process has sub-structure such as metal interconnections, formed on the substrate through a series of previous steps. The photoresist layer may be formed over or on a portion of the substrate. However, it is more common to deposit a photoresist layer over the substrate. The photoresist layer can be deposited over the substrate by a variety of methods, and generally, by a spin coating method.

Next, an exposure mask having a predetermined pattern is arranged in contact with, or a predetermined distance above the photoresist layer. Then, the photoresist layer with the exposure mask is irradiated with a high-energy activating beam, such as ultraviolet (UV) rays, electron beams or X-rays. A portion of the photoresist layer formed over the substrate is exposed to a high-energy activating beam through the mask pattern, and a shielded portion is blocked from the high-energy activating beam by the mask pattern. After irradiation with a high-energy activating beam, the physical properties of the exposed portion change while those of the shielded region are maintained. The photoresist pattern immediately after irradiation, which has a latent pattern with physically changed and unchanged portions, is referred to as a "latent image".

The photoresist layer with the latent image is subjected to a developing process, to transfer the mask pattern onto the photoresist layer, which results in a photoresist pattern. Subsequently, the substrate underlying the photoresist pattern is etched using the photoresist pattern as an etching mask, to form a predetermined pattern in the substrate. Next, the unnecessary photoresist pattern is removed from the substrate, so that a series of photolithography processes are completed.

The present invention relates to the removal of photoresist from a substrate in a photolithography process, which is carried out after the formation of the photoresist pattern on the substrate is completed.

A conventional technique uses an aqueous inorganic acid solution or an aqueous inorganic base solution, as a photoresist remover. Japan Patent Laid-open Publication No. sho 64-42653 discloses a mixture of aromatic hydrocarbon and alkylbenzene sulfonic acid, as a photoresist remover.

However, such existing photoresist removers corrode the lower metal interconnections and are harmful to the human body. For these reasons, use of an organic series solvent as a photoresist remover was taught in Japan Patent Laid-open Publication Nos. hei 4-124668, hei 4-350660, hei 5-273768, and hei 5-281753.

When the organic series solvent is selected as a remover, a substrate to be etched is dipped into the organic series solvent to strip photoresist from the substrate. This dipping technique needs a considerable amount of photoresist remover. Furthermore, an increasing need for a larger semiconductor wafer and a large-screen display, and a trend of mass production contribute to further increasing the amount of photoresist remover required. Such an increase in the amount of photoresist remover required is undesirable in terms of efficiency of the photoresist removal process, and is expensive.

Recently, a single-wafer treatment has been applied to remove photoresist from a large substrate. In a single-wafer treatment system, there are a plurality of tanks including photoresist remover reservoirs, and cleaning chambers containing photoresist remover or deionized water. During the photoresist removal process, in order to prevent the photoresist remover contained in a tank from being contaminated by the photoresist remover from any previously arranged tank, an air knife process is performed, which also extends the usable lifetime of a photoresist remover.

Photoresist residue is generated by drying or wet etching, ashing or ion implantation processes. However, a conventional photoresist remover cannot remove such photoresist residue. Thus, although the air knife process is performed, the remaining photoresist residue can be incorporated into subsequent tanks, thereby shortening the lifetime of the photoresist remover. As a result, the success of a subsequent process cannot be ensured, and a completed semiconductor device or a display may have operational defects.

The photoresist residue may be classified into particulate residue and spot-like residue. The pattern of the residues will be shown more clearly with reference to the appended drawings.

FIG. 1 is an optical microscope photo showing the surface of a substrate 10 after a metal line 15 is formed during a photolithography process, before photoresist is removed from the substrate 10. FIG. 2 is an optical microscope photo showing particulate residue 20 on the surface of the substrate 10 after the photoresist is removed with photoresist remover prepared in Comparative Example 1. FIG. 3 is an optical microscope photo showing spot-like residue 35 remaining on the surface of a substrate 25 during formation of metal lines 30a and 30b, which have different patterns from the metal line 15 of FIGS. 1 and 2. In particular, in the formation of miniature patterns, the presence of such small spot-like residue 35 may cause defects in a device, and thus it is desirable to prevent the occurrence of spot-like residue 35.

DISCLOSURE OF THE INVENTION

To solve the above problems, it is an objective of the present invention to provide a photoresist remover composition capable of completely dissolving and removing photoresist residue generated by dry or wet etching, ashing, or ion implantation processes, with good spreadability with respect to a variety of metal layers, and capable of removing particles falling from the photoresist residue, which are hardly removed even by air knife treatment.

The objective of the present invention is achieved by a photoresist remover composition comprising: 10 to 30% by weight amine compound; 20 to 60% by weight glycol series solvent; 20 to 60% by weight polar solvent; and 0.01 to 3% by weight perfluoroalkylethyleneoxide.

Preferably, the perfluoroalkylethyleneoxide is at least one selected from the group consisting materials having formula (1)

$$R_f\text{—}A\text{—}(CH_2CH_2O)_n\text{—}R \quad (1)$$

where $R_f$ is a perfluoroalkyl group of 1 to 14 carbon atoms; A is —$(CH_2)_m$—O—, —$(CH_2)_m$—$SO_2NR_1$—, —$(CH_2)_m$—$CONR_2$—, —$SO_3$—, —$CO_2$— or —$SO_2N(R_3)CH_2CO_2$—; R is hydrogen or an acyl or alkyl group of 1 to 18 carbon atoms; m is an integer from 0 to 20, n is an integer from 0 to 5; $R_1$, $R_2$ and $R_3$ are hydrogen, an alkyl group of 1 to 6 carbon atoms, or —$(CH_2CH_2O)_x$—$R_4$, x is an integer from 1 to 20; and $R_4$ is an alkyl group of 1 to 6 carbon atoms.

More preferably, in formula (1), A may be —$(CH_2)_m$—O—; $R_f$ is a perfluoroalkyl group of 1 to 14 carbon atoms; m is an integer from 0 to 20; n is an integer from 0 to 5.

Preferably, the amine compound is an aliphatic amine compound.

Preferably, the aliphatic amine compound is at least one of aliphatic primary amine compounds including monoethanol amine, 2-(2-aminoethoxy)ethanol and 2-(2-aminoethylamino)ethanol.

Preferably, the aliphatic amine compound is at least one of aliphatic secondary amine compounds including diethanol amine, iminobispropylamine and 2-methylaminoethanol.

Preferably, the aliphatic amine compound is at least one of aliphatic tertiary amine compounds including triethylaminoethanol.

Preferably, the glycol series solvent is at least one selected from the group consisting of ethyleneglycol methylether, ethyleneglycol ethylether, ethyleneglycol butylether, diethyleneglycol methylether, diethyleneglycol ethylether, diethyleneglycol butylether, propyleneglycol methylether, propyleneglycol ethylether, propyleneglycol butylether, dipropyleneglycol methylether, dipropyleneglycol ethylether and dipropyleneglycol butylether.

Preferably, the polar solvent is at least one selected from the group consisting of dimethylsulfoxide, N-methyl-2-pyrrolidone, N,N'-dimethylacetamide, N,N'-dimethylformamide and dimethylimidazolidinone.

BEST MODE FOR CARRYING OUT THE INVENTION

Figure 1:
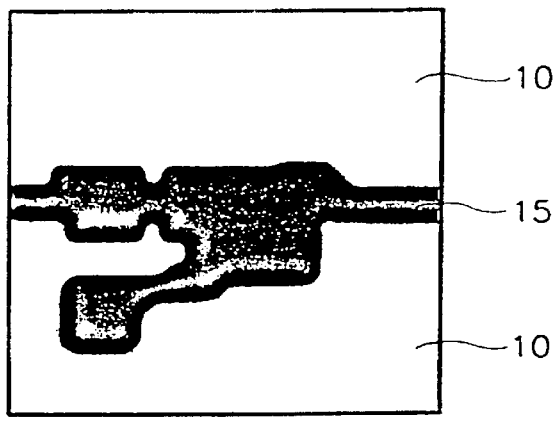
FIG. 1 is an optical microscope photo showing the surface of a substrate with a predetermined pattern, before photoresist is removed from the substrate during a photolithography process.

A photoresist remover composition according to the present invention is characterized by comprising: 10 to 30% by weight amine compound; 20 to 60% by weight glycol series solvent; 20 to 60% by weight polar solvent; and 0.01 to 3% by weight perfluoroalkylethyleneoxide.

Preferably, the perfluoroalkylethyleneoxide is at least one selected from the group consisting materials having formula (1)

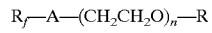

$$R_f\text{—}A\text{—}(CH_2CH_2O)_n\text{—}R \quad (1)$$

where $R_f$ is a perfluoroalkyl group of 1 to 14 carbon atoms; A is —$(CH_2)_m$—O—, —$(CH_2)_m$—$SO_2NR_1$—, —$(CH_2)_m$—$CONR_2$—, —$SO_3$—, —$CO_2$— or —$SO_2N(R_3)CH_2CO_2$—; R is hydrogen or an acyl or alkyl group of 1 to 18 carbon atoms; m is an integer from 0 to 20, n is an integer from 0 to 5; $R_1$, $R_2$ and $R_3$ are hydrogen, an alkyl group of 1 to 6 carbon atoms, or —$(CH_2CH_2O)_x$—$R_4$, x is an integer from 1 to 20; and $R_4$ is an alkyl group of 1 to 6 carbon atoms.

More preferably, in formula (1), A is —$(CH_2)_m$—O—; $R_f$ is a perfluoroalkyl group of 1 to 14 carbon atoms; m is an integer from 0 to 20; n is an integer from 0 to 5.

When the photoresist remover composition is applied to the surface of a substrate, the perfluoroalkyleneoxide lowers the surface tension of the composition with respect to the lower metal layer. As a result, the photoresist residue sticking to the surface of the wafer can be prevented, so that the air knife process can be smoothly carried out when every single wafer is cleaned in a wet-type photoresist remover.

Preferably, the aliphatic amine compound is at least one of aliphatic primary amine compounds including monoethanol amine, 2-(2-aminoethoxy)ethanol and 2-(2-aminoethylamino)ethanol, at least one of aliphatic secondary amine compounds including diethanol amine, iminobispropylamine and 2-methylaminoethanol, or at least one of aliphatic tertiary amine compounds including triethylaminoethanol. Among these compounds, monoethanol amine is most preferred.

The amine compound of the photoresist remover composition according to the present invention, which is a strong alkali compound, attacks photoresist residue generated or cross-linked, by dry or wet etching, ashing, or ion implantation processes, thereby breaking intra- or intermolecular attraction. As a result, a void is formed in a weak structure of the photoresist residue, thereby resulting in amorphous gel lumps, which are easily removable from the substrate.

Preferably, the glycol series solvent is at least one selected from the group consisting of ethyleneglycol methylether, ethyleneglycol ethylether, ethyleneglycol butylether, diethyleneglycol methylether, diethyleneglycol ethylether, diethyleneglycol butylether, propyleneglycol methylether, propyleneglycol ethylether, propyleneglycol butylether, dipropyleneglycol methylether, dipropyleneglycol ethylether and dipropyleneglycol butylether.

It is more preferably that the glycol solvent is diethyleneglycol methylether, diethyleneglycol ethylether or diethyleneglycol butylether, which has a boiling point of 180° C. or more, and is miscible without limitation.

If a glycol series solvent having a boiling point of 180° C. or more is used, the glycol series solvent cannot be vaporized even when the removal of photoresist is carried out at a high temperature, so that the initial composition of the photoresist remover can be maintained. As a result, the photoresist removing capability of the photoresist remover can be maintained through the photoresist removing process. Furthermore, the glycol series solvent having a boiling point of 180° C. or more lowers the surface tension between photoresist and an underlying metal layer, so that efficiency of removing photoresist can be improved. The glycol series solvent has a low freezing point and a high ignition point, and thus is favorably stable during storage.

The polar solvent of the photoresist remover composition according to the present invention may be dimethylsulfoxide, N-methyl-2-pyrrolidone, N,N'-dimethylacetamide, N,N'-dimethylformamide or dimethylimidazol idinone.

In particular, the polar solvent can be used alone, or two or more of the solvents can be mixed for use. The polar solvent breaks down the gel lumps separated from the substrate by the amine compound, which prevents the photoresist falling from the substrate from sticking to the substrate again during a cleaning process. In particular, the polar solvent having an amine group, such as N-methyl-2-pyrrolidone, makes the infiltration of the amine compound into the photoresist easier.

EXAMPLES 1 THROUGH 5

Photoresist remover compositions containing amine compound, glycol solvent and perfloroalkylethylene oxide in various ratios, which is shown in Table 1, were obtained.

COMPARATIVE EXAMPLES 1 THROUGH 3

Photoresist remover compositions were obtained by using N-octylpyrrolidine (OP) and N-dodecylpyrrolidone (DP), instead of perfluoroalkylethylene oxide, for Comparative Examples 1 and 2. For Comparative Example 3, no additive was added, resulting in a photoresist remover composition containing an amine compound, a glycol solvent and a polar solvent.

TABLE 1

| | Constituent of Photoresist Remover Composition | | | | | | | |
|---|---|---|---|---|---|---|---|---|
| | Amine compound | | Glycol solvent | | Polar solvent | | Surfactant | |
| Example | Name | Content (% by weight) | Name | Content (% by weight) | Name | Content (% by weight) | Name | Content (% by weight) |
| Example 1 | MEA | 15 | DGBE | 42 | NMP | 40 | PFAEO | 3 |
| Example 2 | MIPA | 10 | DGEE | 38 | DMI + DMSO | 30 + 20 | PFAEO | 2 |
| Example 3 | MEA | 20 | DGBE | 24 | NMP + DMSO | 20 + 35 | PFAEO | 1 |
| Example 4 | MIPA | 10 | DGEE | 29.9 | NMP + DMAc | 40 + 20 | PFAEO | 0.1 |
| Example 5 | MEA | 30 | DGBE | 29.95 | DMF | 40 | PFAEO | 0.05 |
| Comparative Example 1 | MEA | 15 | DGBE | 42 | NMP | 40 | OP | 3 |
| Comparative Example 2 | MEA | 9 | DPGME | 15 | DMSO | 75 | DP | 1 |
| Comparative Example 3 | DEA | 35 | EGME | 45 | DMF | 20 | — | — |

DEA: diethanol amine;
DGBE: diethyleneglycol monobutyl ether;
DGEE: diethyleneglycol monoethylether;
DMAc: dimethylacetamide;
DMF: dimethylformamide;
DMI: dimethylimidazolidinone;
DMSO: dimethylsulfoxide;
DP: N-dodecylpyrrolidone;
DPGME: dipropyleneglycol monomethylether;
EGME: ethyleneglycol monomethylether;
MEA: monoethanolamine;
MIPA: monoisopopanolamine;
NMP: N-methylpyrrolindone;
OP: N-octylpyrrolidone;
PFAEO: perfluoroalkylethyleneoxide (1) Surface Tension of Photoresist Remover Composition with respect to the type of metal layer Preparation of Samples A metal layer without pattern was formed of aluminum (Al), chromium (Cr), silicon nitride ($SiN_x$) and indium tin oxide (ITO), each on a glass substrate having dimensions of 0.7 mm by 50 mm by 50 mm, and a bare glass substrate without a metal layer was prepared. The thickness of each of the Al, Cr and $SiN_x$ layers was 1300 Å, and the thickness of the ITO layer was 900 Å.

Measurement of Surface Tension

Each of the samples was placed parallel with respect to the ground, and each of the photoresist compositions prepared in Examples 1 through 5, and Comparative Examples 1 through 3, was applied to each of the samples, and left for 5 minutes. Subsequently, the photoresist remover composition was removed from each of the substrates by an air knife process, and left for 2 another minutes. Next, the pattern of the photoresist remover composition over the glass substrate was visually inspected. The results are shown in Table 2.

TABLE 2

| Example | Type of metal layer | | | | Bare Glass Substrate |
|---|---|---|---|---|---|
| | Al | Cr | $SiN_x$ | ITO | |
| Example 1 | o | o | o | o | o |
| Example 2 | o | o | o | o | o |
| Example 3 | o | o | o | o | o |
| Example 4 | o | o | o | o | o |
| Example 5 | o | o | o | o | o |
| Comparative Example 1 | x | x | x | x | x |
| Comparative Example 2 | x | x | x | x | x |
| Comparative Example 3 | x | x | x | x | x | o: shrinkage of the photoresist remover composition was not shown due to a weak surface tension
x: shrinkage of the photoresist remover composition was shown due to a strong surface tension As shown in Table 2, for Examples 1 through 5, which contained the surfactant, PFAEO, shrinkage of the photoresist remover composition on each metal layer did not occur. In contrast, for Comparative Examples 1 and 2 containing a surfactant, OP and DP, respectively, the photoresist remover compositions were shrunken on the surface of each metal layer. As for Comparative Example 3, which did not contain any surfactant, the shrinkage of the photoresist remover composition occurred on the surface of each metal layer, due to strong surface tension, as in Comparative Examples 1 and 2.

(2) Amount of Photoresist Residue left After Air Knife Process

PREPARATION OF SAMPLES

An Al layer, a Cr layer and a $SIN_x$ layer were deposited each on a glass substrate having dimensions of 0.7 mm by 50 mm by 50 mm. After drying each glass substrate having the metal layer, a commercially available photoresist (DTFR-3600, manufactured by Dongjin Semichem. Co., Ltd, Korea) was deposited over each of the samples to have a thickness of 1.5 μm. Next, each of the samples having a photoresist layer was heated on a hot plate at 110° C. for 90 seconds to dry the photoresist layer. A mask with a predetermined pattern was put on the photoresist layer of each substrate, and irradiated with ultraviolet (UV) rays. The photoresist layer exposed to UV rays was developed in a 2.38%-tetramethylammonium hydroxide (TMAH) solution (DPD-100S, manufactured by Dongjin Semichem. Co., Ltd., Korea) at 21° C. for 90 seconds. The samples were hard baked in a dry oven, so that a predetermined photoresist pattern was formed on the Al layer, Cr layer, $SiN_x$ layer of the samples. The samples were immersed in an etchant to etch each of the metal layers exposed through the photoresist pattern, thereby resulting in a metal pattern on each substrate. The substrates having a metal pattern were cleaned with deionized water and dried with nitrogen gas.

Measurement of the Amount of Photoresist Residue

Each of the samples was placed parallel with respect to the ground, and each of the photoresist remover compositions prepared in Examples 1 through 5, and Comparative Examples 1 through 3, was applied to each of the samples, and left for 5 minutes. Subsequently, the photoresist remover composition was removed from each of the substrates by an air knife process, and left for 2 another minutes. Next, the samples were cleaned in deionized water for 30 seconds and dried with nitrogen gas. The amount of photoresist residue, which was left on the glass substrates after the air knife process, was counted for each of the samples treated with the photoresist remover compositions from Examples 1 through 5, and Comparative Examples 1 through 3. The results are shown in Table 3.

TABLE 3

| | Type of Metal Layer | | | | | |
|---|---|---|---|---|---|---|
| | Al Layer | | Cr Layer | | Active Layer | |
| Example | Particulate residue | Spot-like residue | Particulate residue | Spot-like residue | Particulate residue | Spot-like residue |
| Example 1 | 1 | 0 | 0 | 0 | 0 | 0 |
| Example 2 | 0 | 0 | 0 | 0 | 1 | 0 |
| Example 3 | 0 | 0 | 0 | 0 | 0 | 0 |
| Example 4 | 0 | 0 | 0 | 0 | 1 | 0 |
| Example 5 | 0 | 0 | 0 | 0 | 1 | 0 |
| Comparative Example 1 | 8 | >30 | 3 | 0 | 39 | 0 |
| Comparative Example 2 | 16 | >30 | 5 | 0 | 32 | 0 |
| Comparative Example 3 | 7 | >30 | 1 | 0 | 23 | 0 |

Figure 2:
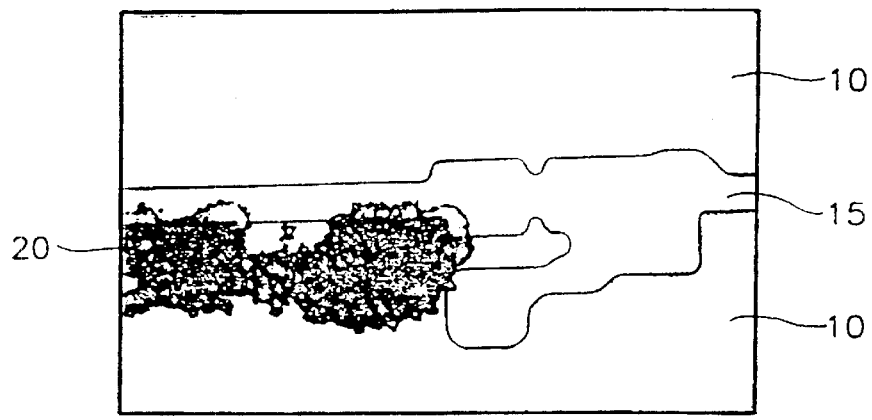
FIG. 2 is an optical microscope photo showing particulate photoresist residue remaining on the surface of a substrate, after the photoresist of FIG. 1 is removed from the substrate using a photoresist remover prepared in Comparative Example 1.
Figure 3:
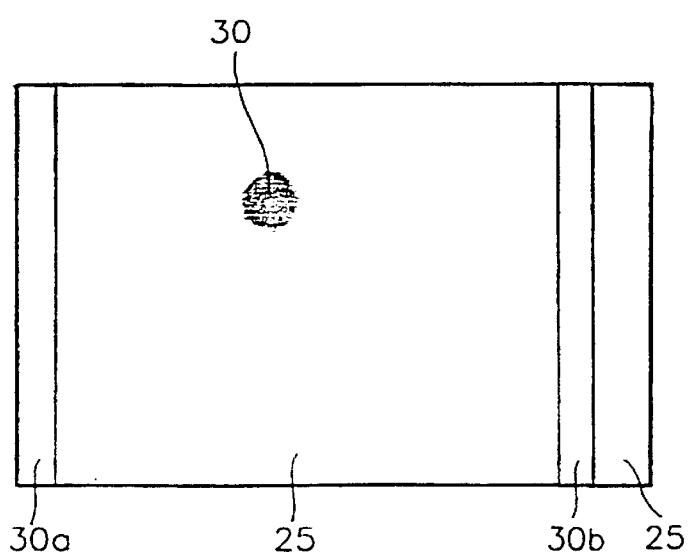
FIG. 3 is an optical microscope photo showing spot-like photoresist residue remaining on the surface of a substrate, after photoresist is removed from the substrate using the photoresist remover prepared in Comparative Example 1.

In Table 3, the term "active layer" refers to the top of a layered structure including a $SiN_x$ layer, an amorphous silicon layer and an $n^+$-amorphous Si layer sequentially stacked over a glass substrate. For distinct comparison among the photoresist remover compositions obtained in Examples 1 through 5, and Comparative Examples 1 through 3, the evaluation was performed in extreme conditions. FIGS. 2 and 3 are optical microscope photos showing particulate residue and spot-like residue, respectively, on the substrate treated with the photoresist remover composition of Comparative Example 1 after the air knife process. As shown in Table 3, for Examples 1 through 5 to which perfluoroalkylethylene oxide was added as a surfactant, the photoresist residue is almost completely removed by the air knife process regardless of the type of metal layer.

(3) Photoresist Removing Capability of Photoresist Remover Composition

Preparation of Samples

A $SiN_x$ layer was deposited over a plurality of glass substrates having dimensions of 0.7 mm by 50 mm by 50 mm to have a thickness of 1300 Å. After drying each glass substrate having the metal layer, a commercially available photoresist (DTFR-3600, manufactured by Dongjin Semichem., Co., Ltd., Korea) was deposited over each of the samples to have a thickness of 1.5 μm. Next, each of the samples having a photoresist layer was heated on a hot plate at 110° C. for 90 seconds to dry the photoresist layer.

A mask with a predetermined pattern was put on the photoresist layer of each substrate, and irradiated with ultraviolet (UV) rays. The photoresist layer exposed to UV rays was developed in a 2.38%-tetramethylammonium hydroxide (TMAH) solution (DPD-100S, manufactured by Dongjin Semichem. Co., Ltd., Korea) at 21° C. for 90 seconds. The samples were hard baked in a dry oven, so that a predetermined photoresist pattern was formed on the $SiN_x$ layer of each of the samples. The samples were etched by plasma etching in a mixture of gases including $SF_6$, $CF_4$ and $CHF_3$, to form a metal pattern along the photoresist pattern. Subsequently, the surface of the photoresist, which was cured by the dry etching process, was removed by plasma ashing. The resulting samples were baked on a hot plate at 140° C. or 170° C. for 10 minutes.

Evaluation of Photoresist Removing Capability

The cured photoresist pattern was removed from each substrate using each of the photoresist remover compositions obtained in Examples 1 through 5, and Comparative Examples 1 through 3, whose temperature was adjusted at 70° C. Then, it was observed using an optical microscope whether the photoresist was present or not. A period of time required for completely removing the photoresist from each substrate was measured. The results are shown in Table 4.

TABLE 4

| Example | Baking Conditions | |
|---|---|---|
| | 140° C. for 10 minutes | 170° C. for 10 minutes |
| Example 1 | <5 seconds | <30 seconds |
| Example 2 | <5 seconds | <60 seconds |
| Example 3 | <5 seconds | <30 seconds |
| Example 4 | <5 seconds | <60 seconds |
| Example 5 | <5 seconds | <30 seconds |
| Comparative Example 1 | <10 seconds | <60 seconds |
| Comparative Example 2 | <10 seconds | <180 seconds |
| Comparative Example 3 | <10 seconds | <60 seconds |

Comparing Example 1 and Comparative Example 1, which have the same composition except for the type of surfactant added, when PFAEO is used as a surfactant, the photoresist removing capability is superior to the other case. The photoresist removing capability is excellent for Examples 2 through 4, compared to Comparative Examples 1 through 3.

As previously described, the photoresist remover composition according to the present invention exhibits excellent photoresist stripping capability when the photoresist residue is generated by dry or wet etching, ashing and ion implantation. In addition, the photoresist remover composition has superior spreadability for a variety of metal layers including an Al layer, and barely corrodes these metal layers. Furthermore, during an air-knife process for removing photoresist remover composition from a single wafer, which has been widely applied in the manufacture of LCDs, sticking of the photoresist to the substrate can be prevented.

What is claimed is:

1. A photoresist remover composition comprising:

10 to 30% by weight amine compound;

20 to 60% by weight glycol series solvent;

20 to 60% by weight polar solvent; and 0.01 to 3% by weight perfluoroalkylethyleneoxide.

2. The photoresist remover composition of claim 1, wherein the perfluoroalkylethyleneoxide is at least one selected from the group consisting materials having formula (1)

$$R_f\text{—}A\text{—}(CH_2CH_2O)_n\text{—}R \tag{1}$$

where $R_f$ is a perfluoroalkyl group of 1 to 14 carbon atoms; A is —$(CH_2)_m$—O—, —$(CH_2)_m$—$SO_2NR_1$—, —$(CH_2)_m$—$CONR_2$—, —$SO_3$—, —$CO_2$— or —$SO_2N(R_3)CH_2CO_2$—; R is hydrogen or an acyl or alkyl group of 1 to 18 carbon atoms; m is an integer from 0 to 20, n is an integer from 0 to 5; $R_1$, $R_2$ and $R_3$ are hydrogen, an alkyl group of 1 to 6 carbon atoms, or —$(CH_2CH_2O)_x$—$R_4$, x is an integer from 1 to 20; and $R_4$ is an alkyl group of 1 to 6 carbon atoms.

3. The photoresist remover composition of claim 2, wherein in formula (1), A is —$(CH_2)_m$—O—; $R_f$ is a perfluoroalkyl group of 1 to 14 carbon atoms; m is an integer from 0 to 20; n is an integer from 0 to 5.

4. The photoresist remover composition of claim 1, wherein the amine compound is an aliphatic amine compound.

5. The photoresist remover composition of claim 4, wherein the aliphatic amine compound is an aliphatic primary amine compound selected from the group consisting of monoethanol amine, 2-(2-aminoethoxy)ethanol and 2-(2-aminoethylamino)ethanol.

6. The photoresist remover composition of claim 4, wherein the aliphatic amine compound is an aliphatic secondary amine compound selected from the group consisting of diethanol amine, iminobispropylamine and 2-methylaminoethanal.

7. The photoresist remover composition of claim 4, wherein the aliphatic amine compound is the aliphatic tertiary amine triethylaminoethanol.

8. The photoresist remover composition of claim 1, wherein the glycol series solvent is at least one selected from the group consisting of ethyleneglycol methylether, ethyleneglycol ethylether, ethyleneglycol butylether, diethyleneglycol methylether, diethyleneglycol ethylether, diethyleneglycol butylether, propyleneglycol methylether, propyleneglycol ethylether, propyleneglycol butylether, dipropyleneglycol methylether, dipropyleneglycol ethylether and dipropyleneglycol butylether.

9. The photoresist remover composition of claim 1, wherein the polar solvent is at least one selected from the group consisting of dimethylsulfoxide, N-methyl-2-pyrrolidone, N,N'-dimethylacetamide, N,N'-dimethylformamide and dimethylimidazolidinone.

* * * * *